US007902852B1

(12) United States Patent
Hess et al.

(10) Patent No.: US 7,902,852 B1
(45) Date of Patent: Mar. 8, 2011

(54) HIGH DENSITY TEST STRUCTURE ARRAY TO SUPPORT ADDRESSABLE HIGH ACCURACY 4-TERMINAL MEASUREMENTS

(75) Inventors: Christopher Hess, San Carlos, CA (US); Michele Squicciarini, San Francisco, CA (US)

(73) Assignee: PDF Solutions, Incorporated, San Jose, CA (US)

( * ) Notice: Subject to any disclaimer, the term of this patent is extended or adjusted under 35 U.S.C. 154(b) by 0 days.

(21) Appl. No.: 11/827,322

(22) Filed: Jul. 10, 2007

(51) Int. Cl.
*G01R 31/02* (2006.01)
*G01R 31/26* (2006.01)
(52) U.S. Cl. .............................. 324/762.09; 324/762.01
(58) Field of Classification Search ............... 324/158.1, 324/765, 769
See application file for complete search history.

(56) References Cited

U.S. PATENT DOCUMENTS

| 5,485,095 | A  | * | 1/1996  | Bertsch et al. ............... 324/537 |
| 6,449,749 | B1 |   | 9/2002  | Stine |
| 6,476,633 | B2 | * | 11/2002 | Yokomizo ..................... 324/769 |
| 6,836,133 | B2 | * | 12/2004 | Kinoshita ..................... 324/765 |
| 6,844,751 | B2 | * | 1/2005  | Marshall et al. ............. 324/765 |
| 6,873,173 | B2 | * | 3/2005  | Kollmer et al. .............. 324/769 |
| 6,901,564 | B2 |   | 5/2005  | Stine et al. |
| 6,937,047 | B2 | * | 8/2005  | Tran et al. .................... 324/763 |
| 7,378,290 | B2 | * | 5/2008  | Cowles et al. ................. 438/18 |

OTHER PUBLICATIONS

Staper, C. H., Rosner, R. J., "Integrated Circuit Yield Management and Yield Analysis: Development and Implementation," IEEE Transactions on Semiconductor Manufacturing, pp. 95-102, vol. 8, No. 2, 1995.

Ipri, A. C., Sarace, J. C., "Integrated Circuit Process and Design Rule Evaluation Techniques," RCA Review, pp. 323-350, vol. 38, No. 3, Sep. 1977.

Buehler, M. G., "Microelectronic Test Chips for VLSI Electronics," VLSI Electronics Microstructure Science, pp. 529-576, vol. 9, Chapter 9, Academic Press, 1983.

Doong, K., Cheng, J., Hsu, C., "Design and Simulation of Addressable Fault Site Test Structure for IC Process Control Monitor," International Symposium on Semiconductor Manufacturing, 1999.

"Four Terminal Resistance Measurement", 6th edition: Low Level Measurements Handbook, Keithley Instruments Inc., pp. 2-39 & 3-18, 2004.

* cited by examiner

*Primary Examiner* — Ha Tran T Nguyen
*Assistant Examiner* — Joshua Benitez

(57) ABSTRACT

Circuits for performing four terminal measurement point (TMP) testing of devices under test (DUT) is provided. The DUT and the circuit is to be defined on a semiconductor chip. The circuit includes a DUT having a first terminal and a second terminal, where the first terminal of the DUT is connectable to a first terminal measurement point and a third terminal measurement point, and the second terminal of the DUT is connectable to a second terminal measurement point and a fourth terminal measurement point. A first transistor is provided to select access to the first terminal measurement point, a second transistor is provided to select access to the third terminal measurement point, a third transistor is provided to select access to the second terminal measurement point; and a fourth transistor is provided to select access to the fourth terminal measurement point. In one example, the DUT is linked to neighboring DUTs, and selected ones of the first through fourth transistors are shared, thus reducing the number of transistors per DUT in a DUT bank, and reducing the area needed to implement DUT bank testing for addressable 4-TMP testing. The compact circuitry further enables DUT bank stacking in rows, addressing of columns of DUTs for conditional testing, and three dimensional stacking of DUT banks on different levels.

20 Claims, 16 Drawing Sheets

HIGH DENSITY TEST STRUCTURE ARRAY TO SUPPORT ADDRESSABLE HIGH ACCURACY 4-TERMINAL MEASUREMENTS

BACKGROUND

1. Field of the Invention

The present application generally relates to device under test (DUT) arrays and, more particularly, to a layout for DUT arrays used to detect defects during semiconductor wafer manufacturing.

2. Description of Related Art

To assist in evaluating and/or controlling a semiconductor fabrication process, integrated circuit devices are formed on a wafer for the purpose of electrically testing these devices, which are referred to as devices under test (DUTs), using a wafer tester. Typically, a wafer with DUTs formed thereon is positioned within a wafer tester. The wafer tester has an array of probes that make electrical contact with contact pads for the DUTs on the wafer. The wafer tester then performs electrical testing of the DUTs. Random defects (e.g., particles or the like) can cause electrically measurable faults (killer defects), which are dependent on the chip layout as well as the layer and location of the defects.

Also, certain layout geometries can cause systematic faults dependent on specific combinations of layout and manufacturing process steps. Random as well as systematic faults are responsible for manufacturing related malfunction of chips. Thus, investigating random and systematic faults is important for yield enhancement and to control the quality of process steps and resulting product chips. Several of these concerns are discussed in Staper, C. H., Rosner, R. J., "Integrated Circuit Yield Management and Yield Analysis: Development and Implementation," IEEE Transactions on Semiconductor Manufacturing, pp. 95-102, Vol. 8, No. 2, 1995, which is incorporated by reference herein. Test structures, therefore, are used to detect faults, to identify and localize defects, as well as to characterize systematic manufacturability of layout geometries Many test structures types that use via or contact chains, snake and comb lines etc. have been described to detect defects, e.g. in Ipri, A. C., Sarace, J. C., "Integrated Circuit Process and Design Rule Evaluation Techniques," RCA Review, pp. 323-350, Volume 38, Number 3, September 1977, and Buehler, M. G., "Microelectronic Test Chips for VLSI Electronics," VLSI Electronics Microstructure Science, pp. 529-576, Vol 9, Chapter 9, Academic Press, 1983, both of which are incorporated by reference herein.

Two parallel via chains are described in Doong, Kelvin, Cheng, J., Hsu, C., "Design and Simulation of Addressable Fault Site Test Structure for IC Process Control Monitor," International Symposium on Semiconductor Manufacturing, 1999, which is incorporated herein by reference.

For all these test structures, the resistance over the DUT has to be measured. For that, a so called "Four Terminal Resistance Measurement" is executed, as shown in FIGS. 2-32 and 3-15 of "6$^{th}$ Edition: Low Level Measurements Handbook", Keithley Instruments Inc., pp. 2-39 & 3-18, 2004, which is incorporated herein by reference. On page C-4, the measurement is described as "A measurement where two leads are used to supply a current to an unknown, and two different leads are used to sense the voltage drop across the resistance." In this manner, the resistance can be measured for snakes, combs, via chains and parallel devices as mentioned earlier.

FIG. 1 illustrates a simplified example of a circuit 100 used to test a DUT 110 using a 4-Terminal Measurement Points (4-TMP) scheme. As shown, the circuit 100 includes TMP1 and TMP3 coupled to an end of the DUT 110 and respectively to resistor 102 and resistor 106. TMP2 and TMP4 are coupled to another end of the DUT 110 and respectively to resistor 104 and resistor 108. A voltage source is coupled to resistor 102, and which leads to TMP1. A voltage meter is coupled between TMP3 and TMP4, through resistors 106 and 108, respectively. A current meter is coupled to resistor 104, which links to TMP2. The circuit 100, therefore represents a schematic embodiment for testing four terminal resistance performance of DUT 110. However, DUT 110 of FIG. 1 is only one DUT, and to test additional DUTs, other logic would be needed to enable addressing.

FIG. 2 illustrates an example where the circuit 100 of FIG. 1 is modified, so that transmission gates 122 are used in circuit 120. The use of transmission gates is known, but as can be appreciated, the use of transmission gates 122a-122d, to address/select DUT 110, will add a substantial number of transistors. In circuit 120, eight (8) transistors are needed to enable specific access to DUT 110, when conducting a 4-TMP testing scheme. Although it is possible to conduct testing of DUT 110, it should be appreciated many performance tests will require testing of many DUTs 110, either individually or in series. Consequently, each DUT 110, using the circuitry of FIG. 2, will require 8 transistors. The area on a chip needed to layout the 8 selection transistors, as can be expected, will be large. For this reason, only small DUT 110 arrays are possible with know selection transistor schemes. This places a limit on the number of DUTs and the data that can be obtained from specific testing.

All test structures mentioned above are usually connected to individual terminal or pads for testing. In some cases, far more than 1000 differently designed test structures per layer may be required to achieve yield and performance improvements, as described in detail in U.S. Pat. Nos. 6,449,749 and 6,901,564, entitled: System and Method for Product Yield Prediction, both of which are incorporated by reference herein. With the demand for more dense and compact placement of DUTs, it can be appreciated that the circuit 120 scheme of the prior art places significant constraints on testing structures and algorithms.

For detecting a completely failing test structure, where its measured resistance is many orders of magnitude different from its expected value, it is fine to use large area test structures. The large area for a single DUT might be in the order of ±100 um by 100 um. However, so called "soft failing" events have become more severe in semiconductor manufacturing, where just a small fraction of a test structure changes its local resistance by as little as one order of magnitude compared to its expected value. Detecting such soft fails requires access to smaller test structure segments, since a soft fail will not be detectable within a single large area test structure. Further, it is difficult or impossible to place all those thousands of small test structures on a single test chip if they are all connected to individual pads for testing, since there is not enough area to place all pads. Further, because of the large size of prior art DUTs, many times it is not possible to perform localization (e.g., to find the failing DUT in an array) nor to perform analysis of soft fails.

In view of the forgoing, there is a need for circuits that enable accurate four terminal measurement point (4-TMP) analysis of DUTs, where the access circuitry to each DUT uses compact logic that minimizes area layout, thus enabling densely arranged DUT arrays for complex 4-TMP processing of DUT performance parameters.

SUMMARY

Broadly speaking, the present invention fills these needs by providing circuitry for accessing DUTs, to enable 4-TMP analysis of DUT performance parameters and characteristics. The circuitry is compact, which reduces the amount of logic necessary to perform 4-TMP analysis of DUTs. In one embodiment, the compact access and selection circuitry can be configured to enable sharing of logic between DUTs, when banks of DUT are generated. The added reduction in logic, due to sharing, in a DUT bank arrangement further reduces the necessary area needed to complete long DUT bank arrangements, which are needed in 4-TMP analysis, when certain types of faults or errors needed to be identified and quantified. The densely packed DUT banks are of particular use in testing for shorts, opens, leakage, etc., among other parameters. Still further, the DUT banks, due to the dense compact nature, enable testing for soft fails as well as hard fails. If soft fail testing is desired, the DUT banks and the provided access and selection circuitry will enable conditional testing, so as to provided access to one particular DUT in a DUT bank, or groups of DUTs in a DUT bank, or all DUTs in a DUT bank.

Further yet, the circuitry is configured to enable stacking of DUT banks, where associated stage selection circuits can identify particular banks of DUTs for testing. Also provided is the ability to stack DUT banks on multiple levels, to define a three dimensional layered DUT bank structure. Associated stage selection logic is provided to enable selection of particular DUT banks in each layer, and associated rows in each layer.

These and other features will be further described with reference to the appended drawings and claims. Although circuitry is described in detail, it should be appreciated that the present invention can be implemented in numerous ways, including as an apparatus, a method and a system. Several inventive embodiments of the present invention are described below.

In one embodiment, a circuit for performing four terminal measurement point (TMP) testing of devices under test (DUT) is provided. The DUT and the circuit is to be defined on a semiconductor chip. The circuit includes a DUT having a first terminal and a second terminal, where the first terminal of the DUT is connectable to a first terminal measurement point and a third terminal measurement point, and the second terminal of the DUT is connectable to a second terminal measurement point and a fourth terminal measurement point. A first transistor is provided to select access to the first terminal measurement point, a second transistor is provided to select access to the third terminal measurement point, a third transistor is provided to select access to the second terminal measurement point; and a fourth transistor is provided to select access to the fourth terminal measurement point. In this embodiment, where the DUT is a single standalone DUT, DUT access circuitry for 4-TMP measurement is limited to four transistors. In this embodiment, where the DUT is linked to neighboring DUTs, the four transistors are shared, thus reducing the number of transistors per DUT to 2, except for the first and last DUTs, which are associated with 3 transistors. In a long DUT bank (i.e., chain), the transistors per DUT equal to about 2 transistors per DUT, thus enabling compact DUT banks. The DUT banks can also be stacked in rows, addressed in DUT banks, and stacked three dimensionally on different levels.

In another embodiment, a circuit for four terminal measurement point (TMP) testing of devices under test (DUT) is provided. The circuit includes a DUT. To access the DUT, a pair of p-type access transistors are provided. A terminal of each of the pair of p-type access transistors is coupled to a first end of the DUT and the other ends of the pair of p-type access transistors are coupled to each of a first terminal measurement point and a third terminal measurement point. A pair of n-type access transistors are further provided. A terminal of each of the pair of n-type access transistors is coupled to a second end of the DUT and the other ends of the pair of n-type access transistors are coupled to each of a fourth terminal measurement point and a second terminal measurement point. The DUT is arranged in a bank of two or more DUTs, and each of the two or more DUTs share either the pair of p-type access transistors or the pair of n-type access transistors. In one aspect of this embodiment, the pair of p-type access transistors and the pair of n-type access transistors have their gates coupled together and connected to bank selection logic, the bank selection logic defines conditions for if all or specific ones of the two or more DUTs in a bank are identified for testing. In still another aspect of this embodiment, at least a first level and a second level containing DUTs is defined. The DUTs in the first level or second level are stacked, and are individually selectable, and wherein row and column select logic is provided to the DUTs in each of the first level and the second level.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for circuitry that enables testing of devices under test (DUTs), which are designed and fabricated on a semiconductor wafer, and then fabricated into test chips. The DUTs can take many forms, and the type of DUT used will depend on the type of testing being performed. In some examples, a chip may include multiple types of DUTs, so that different characteristics can be tested from a single chip.

The testing of the DUTs, in accordance with the disclosed embodiments, is related to accurate four (4) terminal measurement point (TMP) testing. As noted above, 4-TMP testing is known, however, current 4-TMP testing circuitry is large, takes up too much space, and is not well suited to carry out localization during soft fail testing, nor efficient hard fail testing. In accordance with one embodiment, the 4-TMP testing circuitry utilizes single transistors to provide access to each of terminal measurement point (i.e., (1), (2), (3) and (4)). In another embodiment, the 4-TMP testing circuitry is designed to enable testing of many DUTs, which can be linked together. The 4-TMP testing circuit, if connected to link neighboring DUTs together, the linking of neighboring DUTs are able to share transistors.

Sharing of transistors, in one embodiment, enables the 4-TMP testing circuitry to reduce the total number of transistors needed to perform an accurate 4-TMP measurement, thus significantly reducing the area on a chip needed to define long banks of DUTs. Additionally, the sharing of transistors, in accordance with one embodiment, allows for more compact changes of DUTs to be defined, and the DUTs, using the shared transistors are able to be conditionally identified for testing, or accessed in parallel to perform soft fail testing. The selection circuitry, in accordance with one embodiment, enables selection of particular DUTs, groups of DUTs, ranges of DUTs, or all DUTs.

Still further, a bank of DUTs, having the sharing capability, also provide stacking capabilities, such that multiple bank rows can be stacked, and selection logic enables identification of particular rows for access to the terminal measurement points 1, 2, 3, and 4. Still further, embodiments are defined, which illustrate level stacked banks of DUTs, which can be addressed to select banks in particular levels or select particular DUTs in given levels, rows, etc. These and other features will be defined in greater detail below.

It will be obvious, however, to one skilled in the art, that the present invention may be practiced without some or all of these specific details. In other instances, well known process operations have not been described in detail in order not to unnecessarily obscure the present invention.

Figure 1:
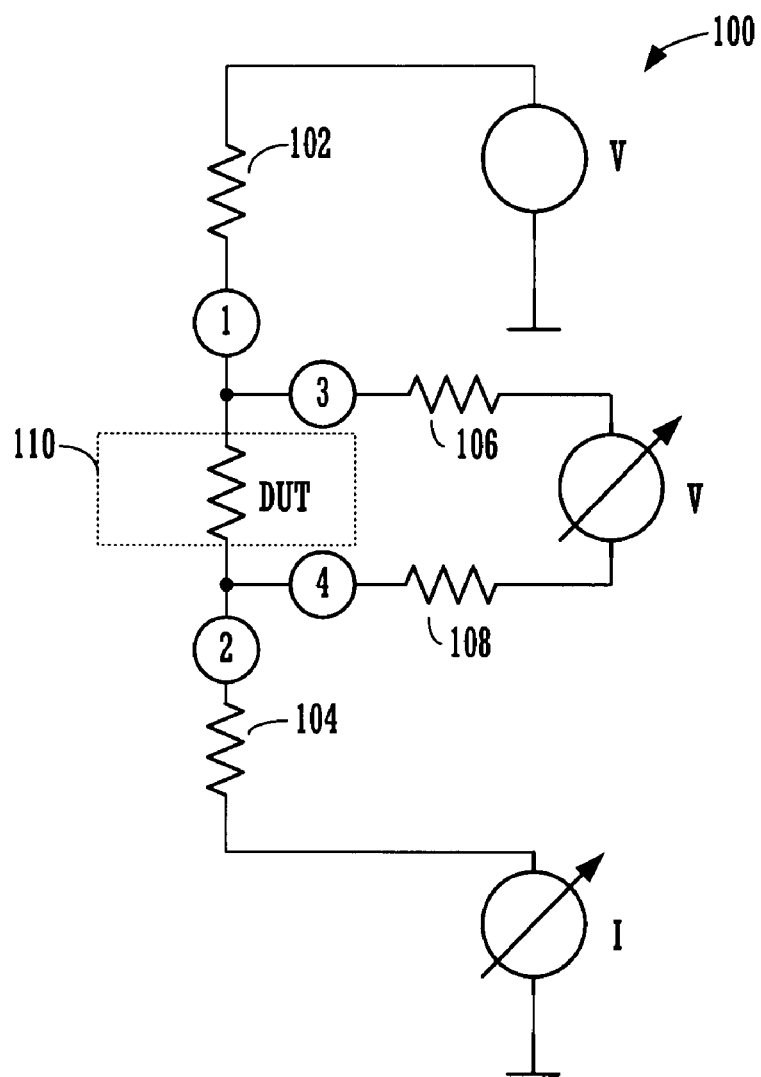
FIGS. 1-2 illustrate prior art diagrams for performing four point measurements on devices under test (DUTs).
Figure 2:
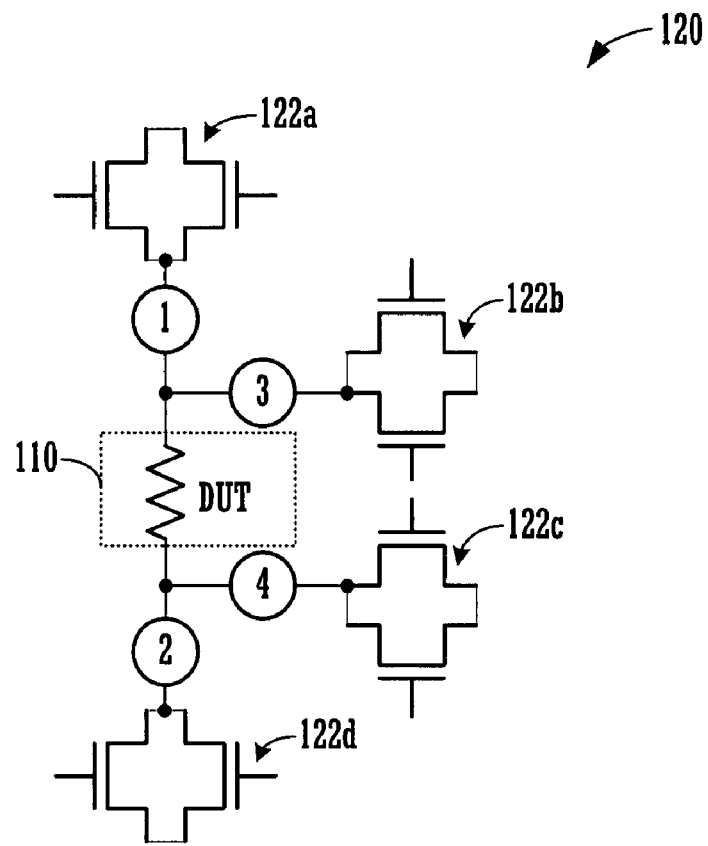
Figure 3:
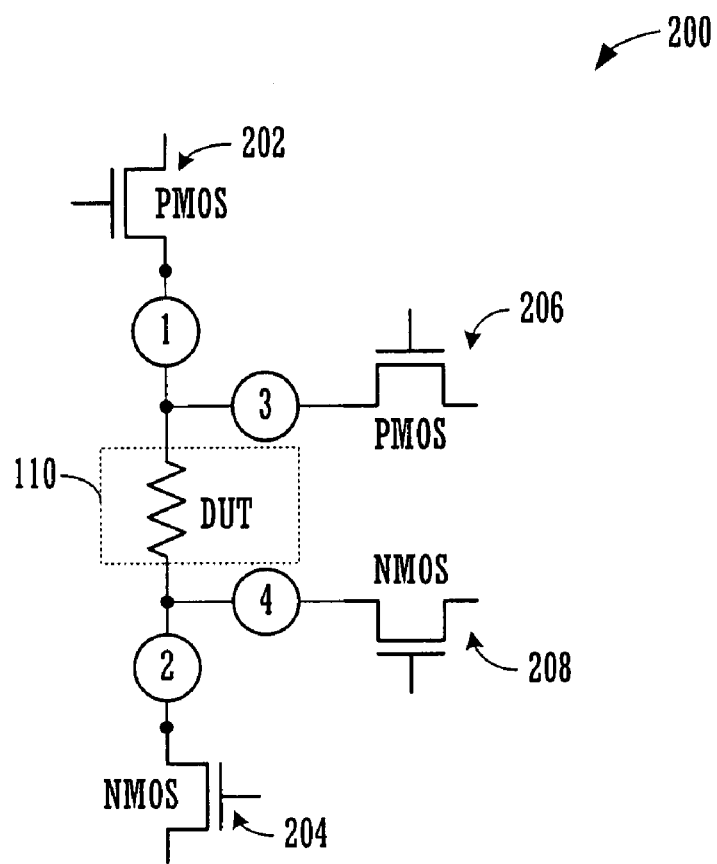
FIG. 3 illustrates access circuitry to a DUT, implementing four transistors, for a reduction in access transistors used in four terminal measurement point (4-TMP) testing, in accordance with one embodiment of the present invention.

FIGS. 1 and 2 were discussed above, with reference to prior art structures and techniques. FIG. 3 illustrates a circuit 200 for use in testing performance characteristics of DUT 110, in accordance with one embodiment of the present invention. Circuit 200 is arranged to enable four terminal measurement points (4-TMP) testing. The 4-TMP testing scheme will utilize individual passgate transistors 202, 204, 206, and 208. As shown, passgate transistor 202 is a PMOS transistor having a terminal connected to TMP1 and passgate transistor 206 is a PMOS transistor having a terminal connected to TMP3. TMP1 and TMP3 are coupled to one end of DUT 110.

DUT 110, in this embodiment is illustrated to be a resistor. Although a resistor is illustrated, it should be understood that any number of devices may be tested using the circuit 200 and its associated 4-TMP testing scheme. For instance, DUT 110 may be a transistor, or any other device requiring testing for resistance, voltage, current, or other device performance characteristics.

A second end of DUT 110 is shown connected to a point where TMP2 and TMP4 are coupled. TMP4 is shown connected to a terminal of passgate 208 that is illustrated to be an NMOS transistor. TMP2 is connected to a terminal of passgate 204 that is shown to be an NMOS transistor. Schematically, the connections of terminals associated with passgates 202-208, which are not connected to TMP points, are connected similarly to circuitry for testing current and voltage characteristics of the DUT 110.

FIG. 3 therefore illustrates circuitry that is capable of providing selective access to TMP1, TMP3, TMP2, and TMP4. Comparing circuit 200 to circuit 120 of FIG. 2, it is shown that only four transistors are required to provide access to complete a 4-TMP testing scheme of DUT 110. Circuit 200 therefore reduces the number of transistors needed to four, whereas the circuit 120 of FIG. 2 required eight. This significant reduction in transistors enables a reduction in footprint and area utilized by the access circuitry for testing a single DUT 110.

Figure 4A:
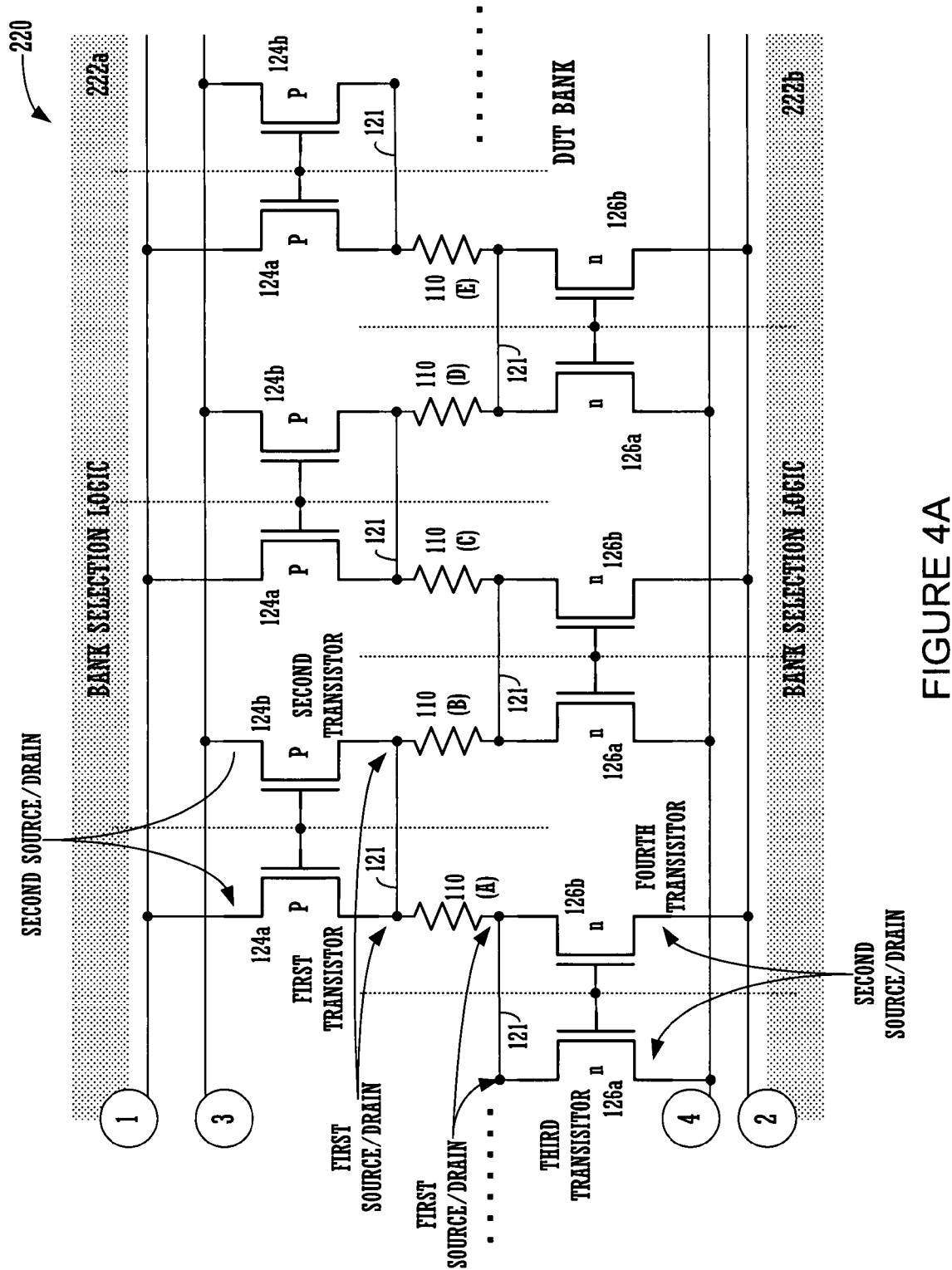
FIGS. 4A-4B illustrate banks of DUTs, and the sharing of transistors among DUTs to further reduce the number of transistors needed per DUT, in a DUT bank, in accordance with one embodiment of the present invention.

FIG. 4A illustrates a DUT bank 220 that is defined by a plurality of DUTs 110 linked together to form a chain of DUTs (e.g., bank of DUTs), in accordance with one embodiment of the present invention. In addition to linking DUTs 110 in a chain configuration, it is noted that each DUT 110 will require its pair of PMOS transistors and pair of NMOS transistors, illustrated as transistors 124a, 124b, and 126a and 126b. In the illustrated example, DUTs 110 in the chain of DUTs are identified for illustration as DUTs A, B, C, D, E, etc.

With reference to DUT A, it is shown that one terminal of DUT 110 is coupled to terminals of both transistors 126a and 126b. Those terminals are coupled together with a linking connection 121. Transistor 126a is shown coupled to TMP4 while the respective terminal of transistor 126b is connected to TMP2. Transistor 124a is connected to TMP1 while transistor 124b is connected to TMP3. The opposing terminals of transistors 124a and 124b are also connected with a link 121. This link 121 is shown to connect DUT 110 A to DUT 110 B. Link 121 therefore establishes a sharing of transistors 124a and 124b of DUT 110 A with DUT 110 B.

In a similar manner, DUT 110 B and 110 C will share transistors 126a and 126b. DUT 110 C and 110 D will share transistors 124a and 124b. DUT 110 D and 110E will share transistors 126a and 126b, and so on. The net result of sharing access transistors to TMP1, TMP3, and TMP2, TMP4, will result in a reduction of transistors needed to perform a 4-TMP testing operation of each of the different DUTs 110 in the DUT bank 220. Aside from the first DUT 110 A, and the last DUT 110 E, DUTs between the first and last DUTs, due to the sharing, will only require two transistors per DUT. Again, in comparison with the number of transistors required in circuit 120 of FIG. 2, two transistors per DUT is a significant reduction over eight transistors per DUT. This is especially important when many of today's tests may require large arrays of DUTs. Example arrays of DUTs may include, for example DUT arrays of $2^n$ rows (e.g., rows of 64, 128, 512, etc.), where each row may be defined by multiple banks, and each bank may include 20, 40, or 60 linked DUTs, or more.

Additionally, a more densely packed arrangement of DUTs can be defined to enable 4-TMP testing for both hard fails and soft fails. Depending on the mode of testing, bank selection logic 222a and 222b is used to define whether the entire DUT bank 220 should be tested serially, or if only particular DUTs should be identified using the bank selection logic 222a and b. In one embodiment, the bank selection logic 222a and b is will share the same addressing, thus simplifying the logic in each of bank selection logic 222a and b. The bank selection logic 222a and 222b is shown, respectively connected to the gates of transistors 124 and 126. Bank selection logic 222a may issue an active LOW signal to transistors 224 so as to turn on access between the TMP1 and TMP3, to each of the DUTs being tested.

If very particular DUTs are being tested, the bank selection logic 222a can issue selectively active LOWs to those DUTs, thus enabling localized and targeted DUT testing. In a like manner, bank selection logic 222b can issue an active HI signal to transistors 226 to either turn on all transistors 226 or selected ones when particular DUTs 110 are to be tested.

Figure 4B:
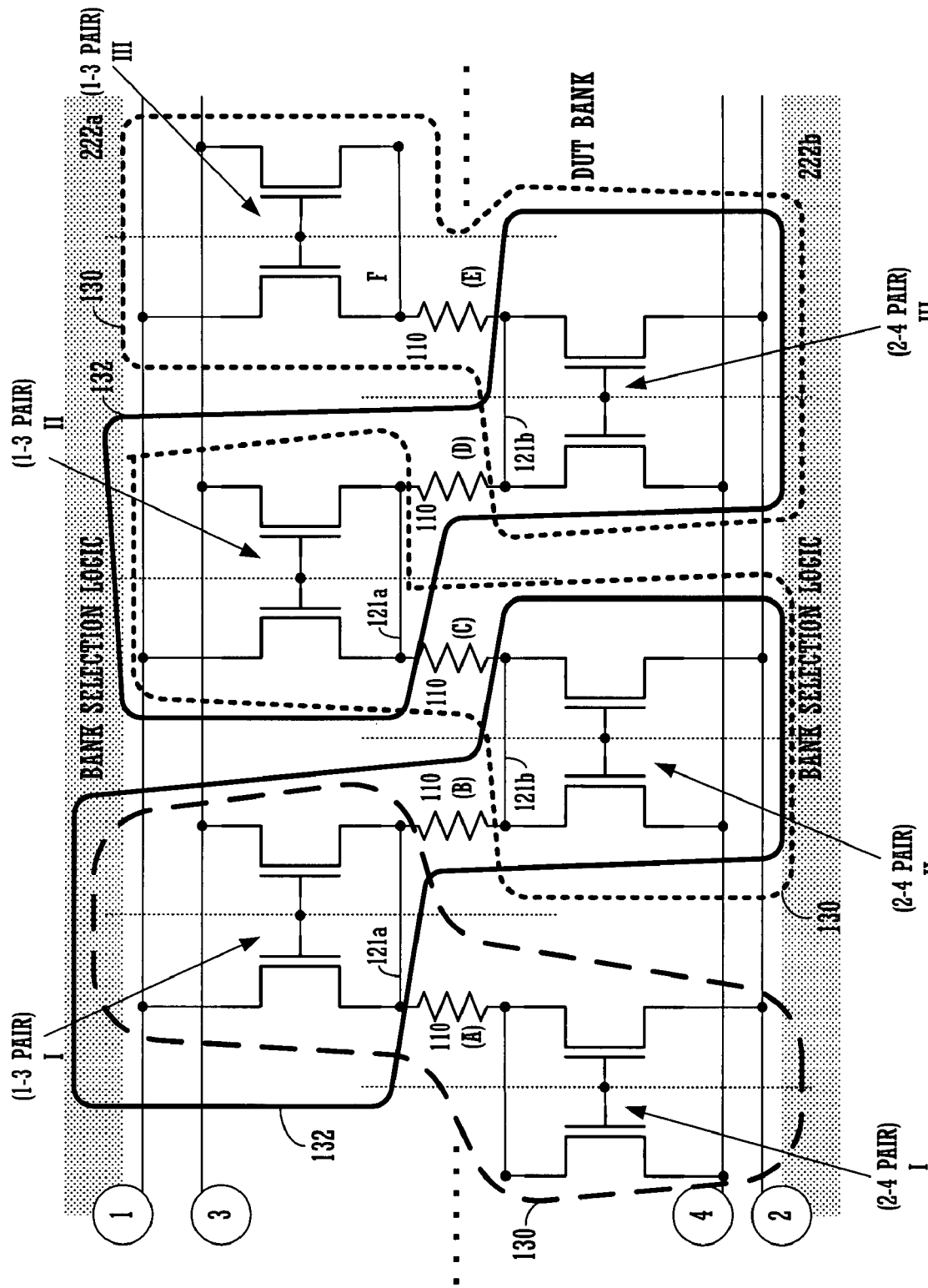

FIG. 4B illustrates the DUT bank 220 of FIG. 4A, with additional identifying markers to point out the sharing of transistors, in accordance with one embodiment of the present invention. The transistors of the DUT bank 220 are circled with group identifiers 130 and 132. Group identifier 130 is a dashed line that encircles TMP2-4 transistor pair II, and TMP1-3 transistor pair I. Solid line defining group identifier 132 is shown sharing TMP1-3 transistor pair I to complete the connection to DUT 110B that is also connected to TMP2-4 transistor pair II.

In this example, TMP2-4 transistor pair II is encircled with group identifier 130 that includes TMP1-3 transistor pair II. In this example, DUT 110C is shown to be sharing TMP2-4 transistor pair II with DUT 110B, and TMP1-3 transistor pair II with DUT 110D. The result of the zig-zag sharing of either TMP1-3 transistor pairs or TMP2-4 transistor pairs, enables a significant reduction in the number of transistors required to complete successful 4-TMP testing of DUTs 110. Consequently, the area needed to lay out a row of DUTs that are interconnected in the shared manner of FIG. 4B, will take up less space, thus enabling compact definition of long DUT strings. The long DUT strings can be useful when testing a number of performance characteristics. Additionally, the bank selection logic 222a and 222b will enable localization of particular DUTs when more drill down testing of particular DUTs is required.

Figure 5:
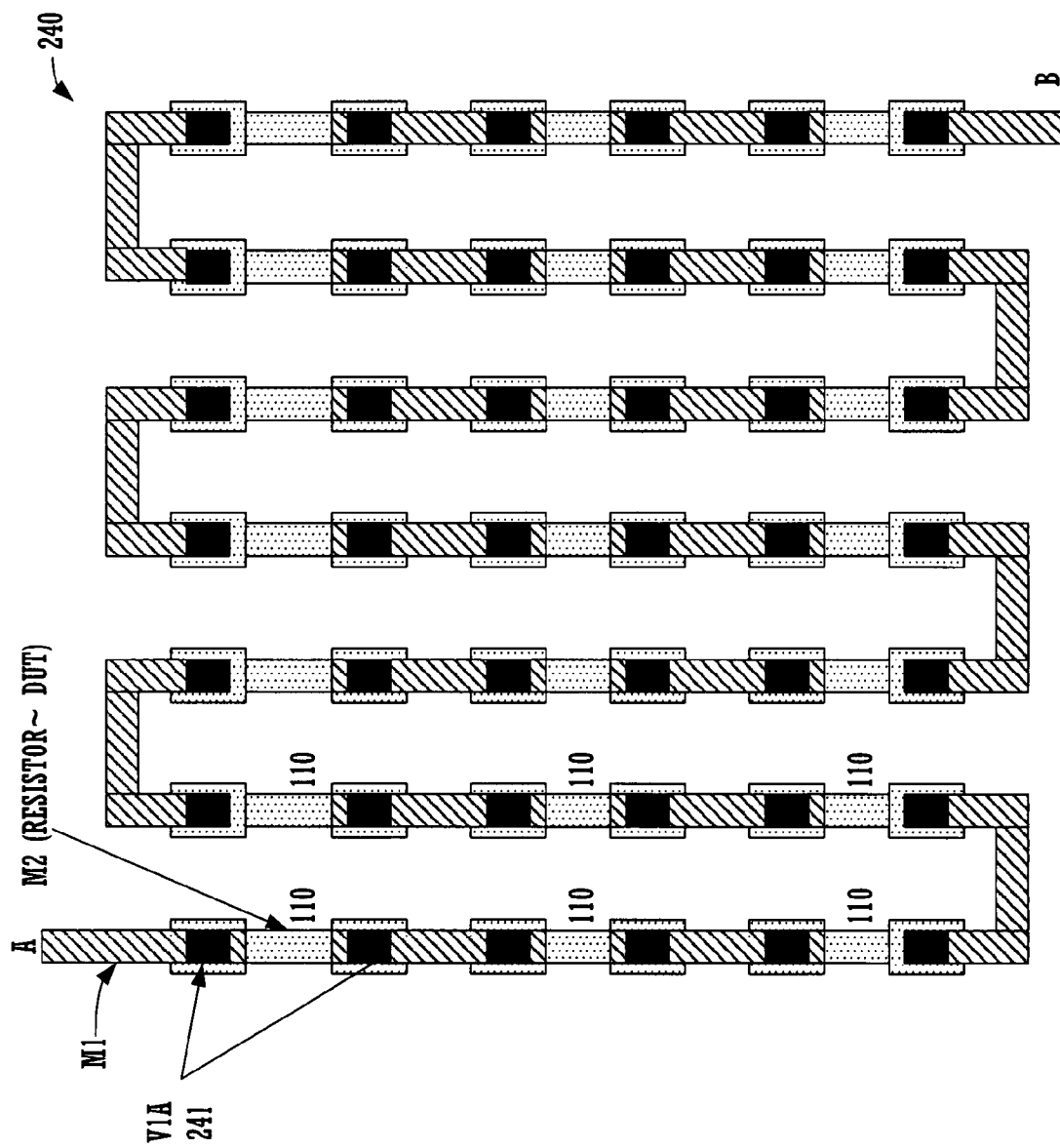
FIG. 5 illustrates an example layout of multiple DUTs, in a snake configuration using via structures, in accordance with one embodiment of the present invention.

FIG. 5 illustrates a snake layout 240 with interconnected DUTs 110. This configuration is achieved by routing metal lines M1 and M2 to define the interconnection as well as the DUTs 110. Interconnections are achieved by the dense snaked orientation, which uses of vias 241. Additional interconnections are then made to the particular transistors 224 and 226 (formed in the silicon level), as defined in FIG. 4A, and which define access to the particular DUTs 110. The diagram of FIG. 5 was provided to illustrate the capability of compactly designing long chains of DUTs for testing 4-TMP processes of specific DUTs, while enabling sharing in a compact layout design. The compact design will therefore enable higher densities for testing, as well as better accuracy in the testing when performing tests for hard fails and soft fails.

Figure 6:
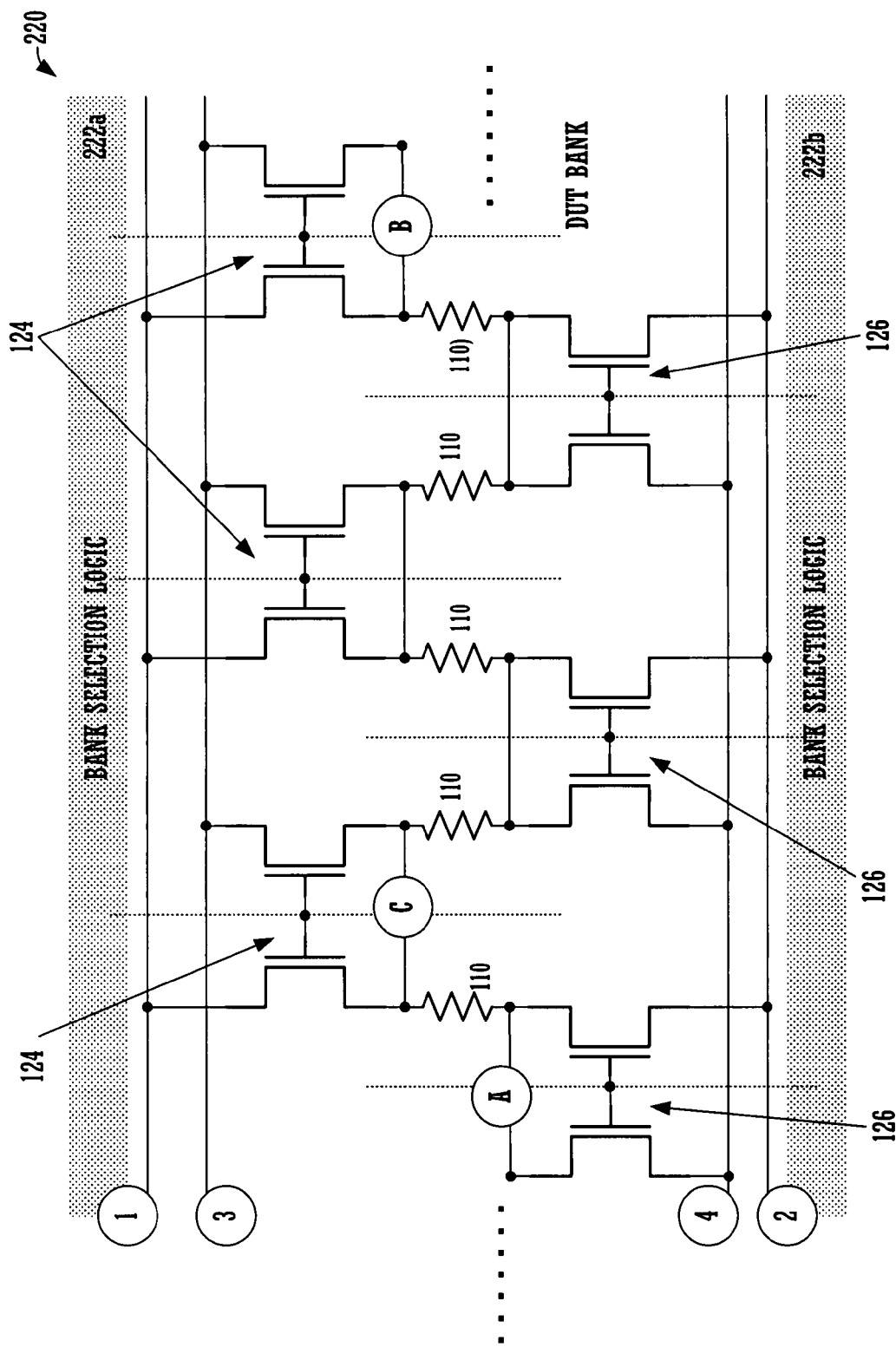
FIG. 6 illustrates the conditional testing capability of the bank selection logic, in accordance with one embodiment of the present invention.

FIG. 6 illustrates a DUT bank 220, as described with reference to FIGS. 4A and 4B, in accordance with one embodiment of the present invention. In this example, it is shown that conditional testing can be performed to detect open circuits in the DUT bank 220. In this example, the testing process may include one where all DUTs within one bank are tested between points A and points B. If a fail is detected, individual DUTs must be tested within the bank.

For instance, bank selection logic 220a and 222b can be used so as to select DUT 110 that lies between point A and point C. Although this example is simplistic in nature, it should be understood that any group of neighboring DUTs can be addressed within a particular bank. For instance, smaller groups of two, three, four, etc. DUTs 110 can be selected for testing or individual DUTs, as noted for the DUT 110 between point A and point C.

Figure 7:
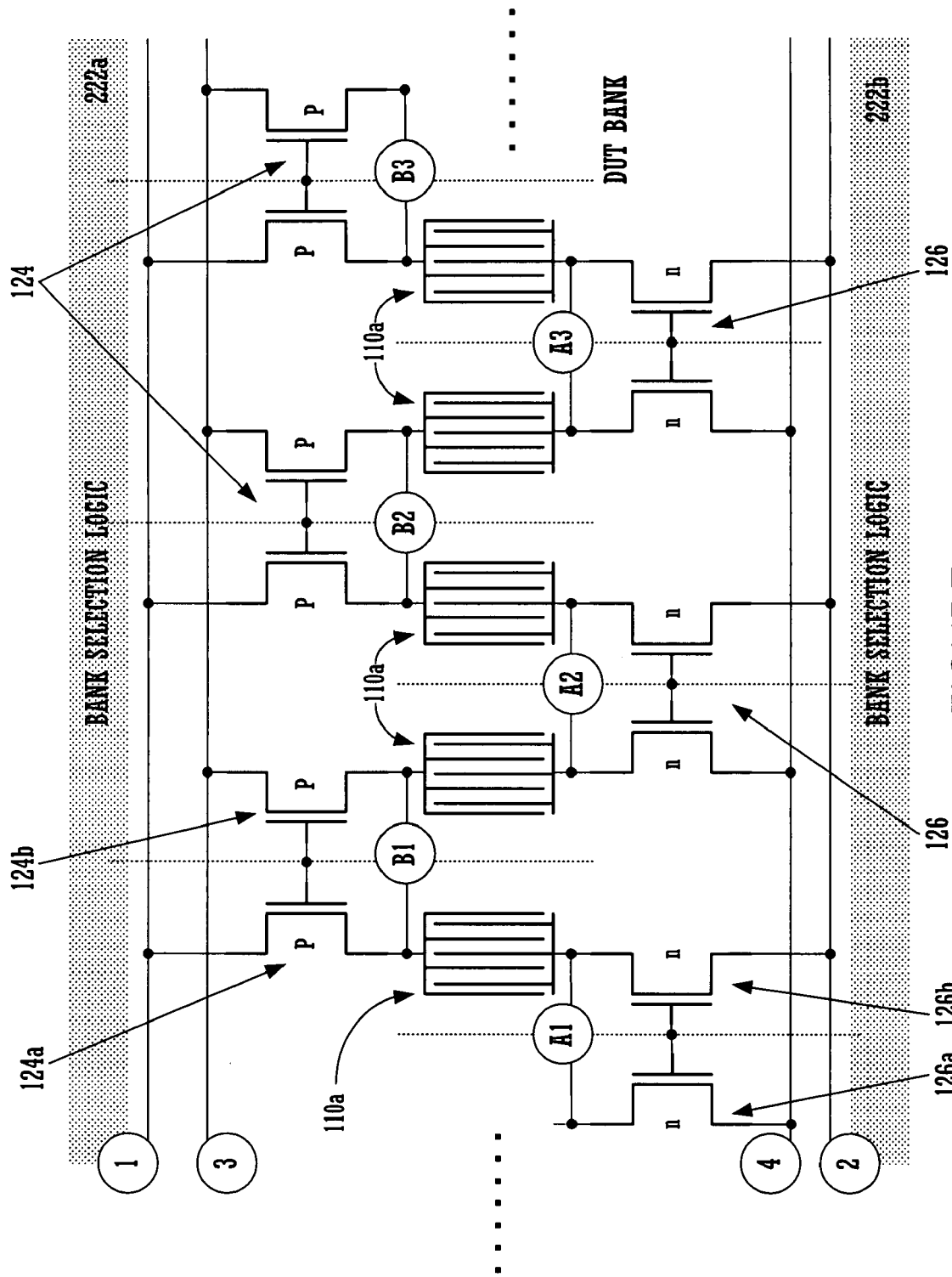
FIG. 7 illustrates a different type of DUT configuration, used to detect shorts, in a 4-TMP testing environment, in accordance with one embodiment of the present invention.

FIG. 7 illustrates an example where DUTs 110a are used instead of the resistor DUT 110. DUTs 110a are defined by comb structures. Connections to each point of the comb structures is enabled similar to the connections to a resistor that defines DUT 110. For instance, one side of a comb structure is connected to terminals of transistors 226a and 226b, between link A1. Transistors 226a and 226b are respectively connected to TMP4 and TMP2. The gates of transistors 226a and 226b are shown coupled to bank selection logic 222b. The other end of the DUT 110a comb structure is connected to a terminal of transistor 124a and 124b, and interconnected by link B1. The respective terminals of transistors 124a and 124b are connected to TMP1 and TMP3, respectively. Similar interconnections are defined for transistors 126 and 124 along the snaked interconnected DUT bank of comb structures.

The conditional testing of the comb structures to detect short circuits can therefore be defined, and in one embodiment, the testing is as follows. The process may include testing all DUTs within one bank. Testing all DUTs within one bank is achieved by turning on all device pairs of transistors 124 and 126, to measure the resistance between all test structures (DUTs 110a) in parallel. If a fail is detected, then testing of individual DUTs 110a within a bank can be performed.

For example, selection of DUTs between points A1 and B1, B1 and A2, A2 and B2, B2 and A3, A3 and B3, etc., can be performed. Of course, any group of neighboring DUTs 110a can be addressed within the bank so as to detect short circuits using the comb structures.

Figure 8:
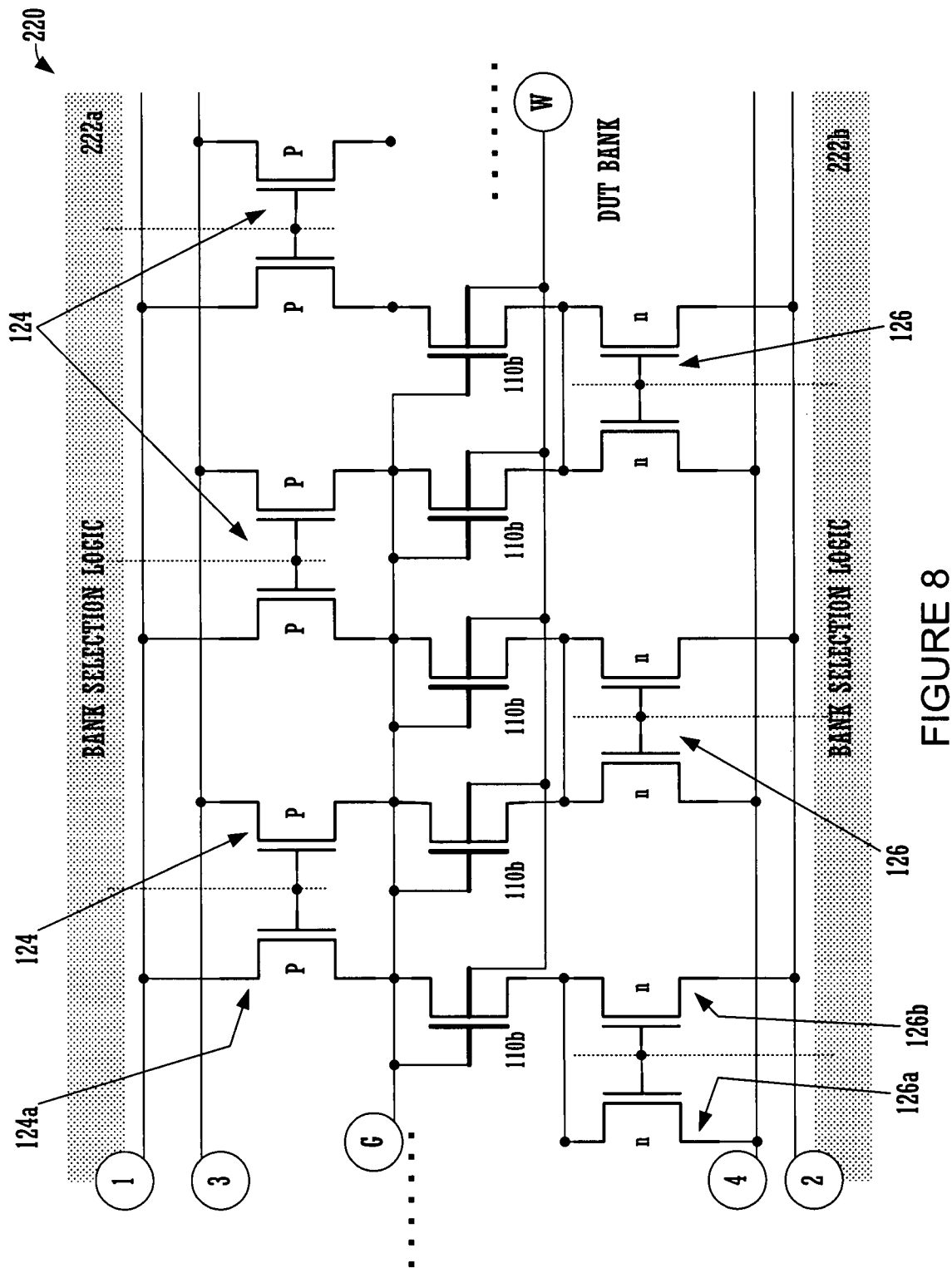
FIG. 8 illustrates a different type of DUT configuration, used to detect current leakage, in a 4-TMP testing environment, in accordance with one embodiment of the present invention.

FIG. 8 illustrates circuitry for testing a bank of DUTs 110b, which are selected for testing leakage currents in a 4-TMP scheme, in accordance of the present invention. In this example, the DUTs 110b are transistor devices that have gates connected to a terminal G and its well connected to a terminal W. The connections to terminals of the transistors 110b are respectively connected to transistors 126 and 124 that provide interconnection to TMP2, TMP4, TMP1, and TMP3.

This example illustrates the use of a common gate pad and a common well pad for all the devices within the array. The terminals of the DUTs 110a are respectively connected to the source and drains of the transistor for testing in a 4-TMP scheme. One method for conditional testing of the array of DUTs 110b is to measure the current in an off condition when access is provided to TMP1, 2, 3 and 4. This is similar to conditional testing sequences used to detect short circuits when comb structures are used as the DUT device. Next, junction leakage between W and 1, or W and 2 are measured using the 4-TMP circuitry. Measurement of the gate to drain leakage between G and 1 is also tested, as well as measurement of the gate to source leakage between G and 2.

Although the sequences for testing are many, and the DUTs 110, 110a, 110b, can vary, it should be understood that the sharing of selection devices 124 and 126 enable for a substantial reduction in transistor count needed to test the DUTs in a 4-terminal measurement point arrangement.

Figure 9:
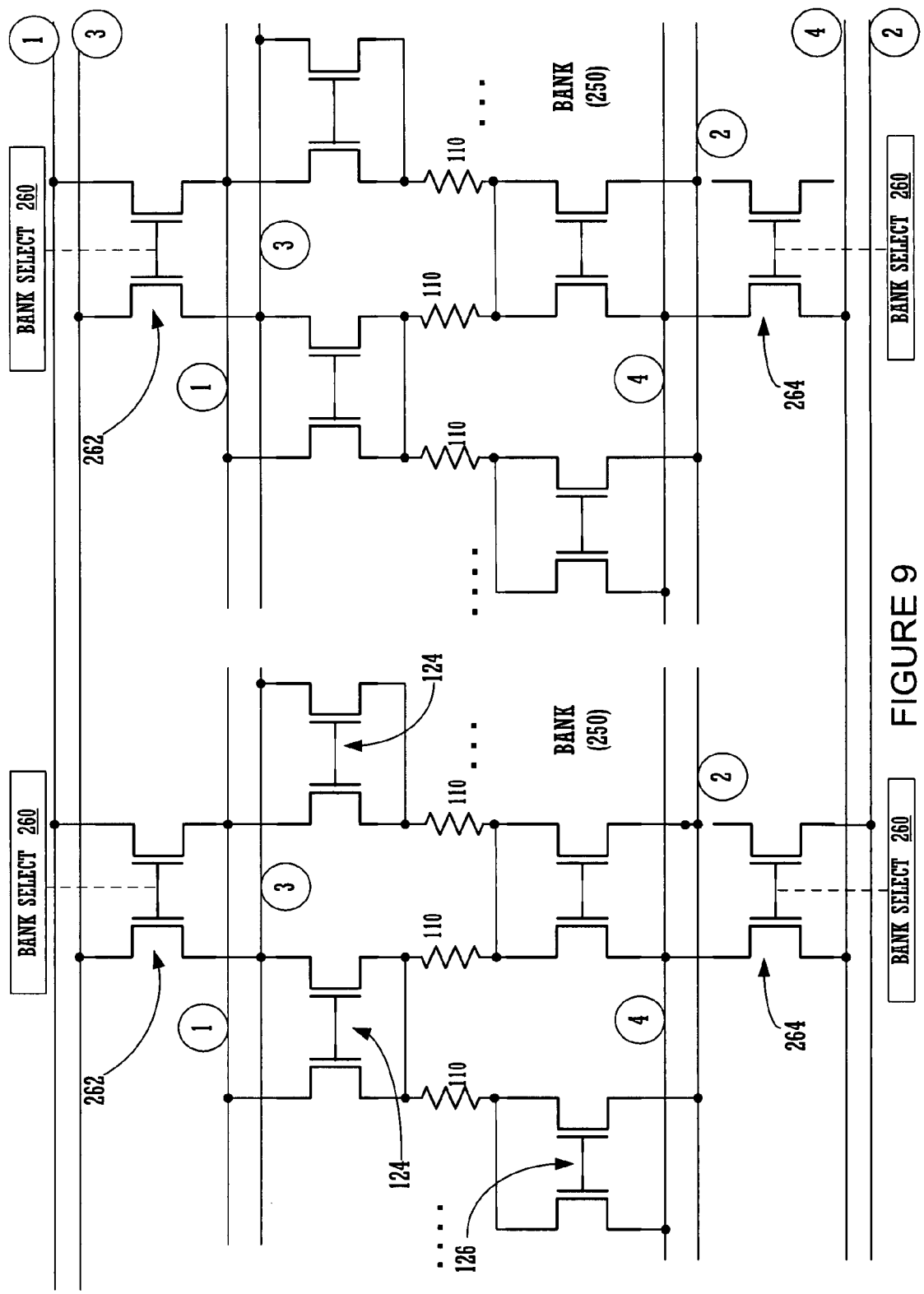
FIG. 9 illustrates stage access of multiple DUT banks, in accordance with one embodiment of the present invention.

FIG. 9 illustrates an example where multiple DUT banks can be further combined to additional stages of selection device's, in accordance with one embodiment of the present invention. Although two stages are illustrated in FIG. 9, it should be understood that many more stages are possible, depending on the particular implementation desired. As shown, the leftmost bank 250 is shown connected to TMP1 and 3, and further, controlled for connection by bank select circuitry 260.

Bank select circuitry 260 is also provided to enable selection of the rightmost bank 250 illustrated in FIG. 9. Bank select 260 is also used when interconnecting both banks 250 to TMP2 and 4. The selections of banks 250 to TMP1 and TMP3 is facilitated by first stage selection transistors 262, while connection to TMP2 and TMP4 is enabled through first stage selection transistors 264. If the leftmost bank is selected, then bank 250 on the left side of the diagram of FIG. 9 will be selected while preventing the bank 250 on the right side of FIG. 9 from accessing TMP1, TMP3, TMP2, and TMP4.

As a result, it is possible to define multiple banks with a given number of DUTs and then accessing those particular banks of interest by using bank select circuitry 260, and the respective first stage selection transistors 262 and 264. As can be appreciated, the banks of FIG. 9 will therefore share the pads that provide access to TMP1, TMP2, TMP3, TMP4. In this particular embodiment, even though multiple banks are provided and individually selected, only one bank will have access to TMP1-TMP4 at a given time, as the pads are shared among the different banks connected and selectable by bank select circuitry 260.

Figure 10:
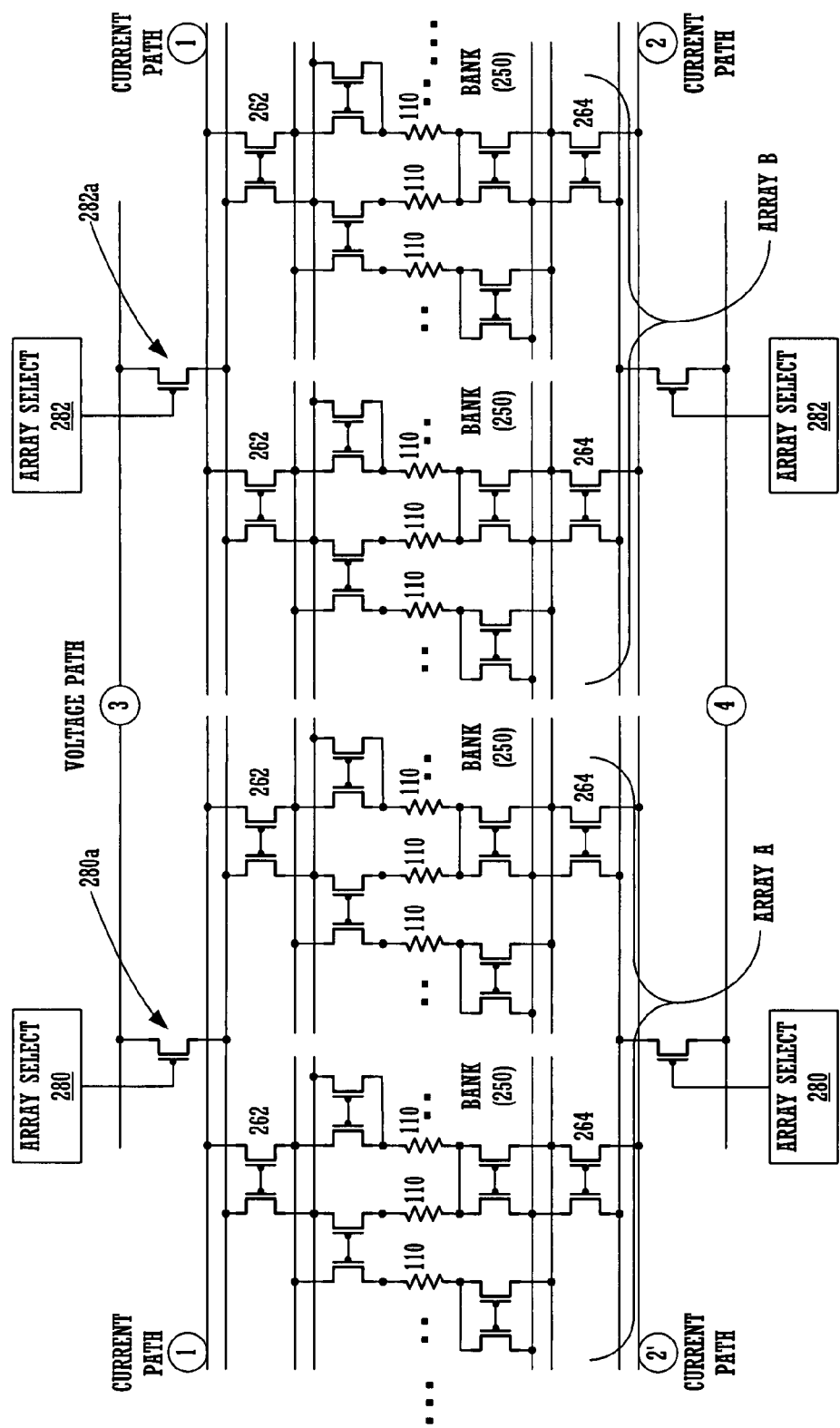
FIG. 10 illustrates stage access to multiple DUT arrays, each having DUT banks, in accordance with one embodiment of the present invention.

FIG. 10 illustrates another embodiment of staging that enables multiple banks to be laid out and separately accessed, depending on the staging access circuitry interconnecting the various 4-TMP points. In addition to the first stage selection transistors 262 and 264 discussed with reference to FIG. 9, the diagram of FIG. 10 includes a second stage transistor 280a that interconnects two groups of multiple banks.

The leftmost group includes banks 250 that interconnect a current path defined by TMP1' and TMP2'. The voltage path of the leftmost group of banks is shown coupled to a voltage path for TMP3 and TMP4, through third stage selection transistors 280a, which respectively couples to array select 280. Array select 282 couples to the second group of banks 250 that are also selectable so that the voltage path TMP3 and TMP4 can be coupled to the second group, while the current path TMP1 and TMP2 is interconnected to the second group of banks 250, using the first stage selection transistors 262 and 264. The first group on the left side of FIG. 10 will therefore define an array A and the right side group of banks 250 will define an array B.

Although each of array A and array B will share the voltage path TMP3 and TMP4 connection points, each array will have its own individual current path as defined by current path TMP1', TMP2', and TMP1 and TMP2. This arrangement may be useful for combining fast voltage measurements through pads (TMP3 and TMP4), while multiple individual current paths are used (TMP1', TMP1, TMP2', and TMP2). The fast voltage measurements are enabled by switching the voltage meter through the different arrays, which is a fast process compared to switching a current meter. Thus, individual current meters will be used as opposed to the switching of the voltage meter.

Figure 11:
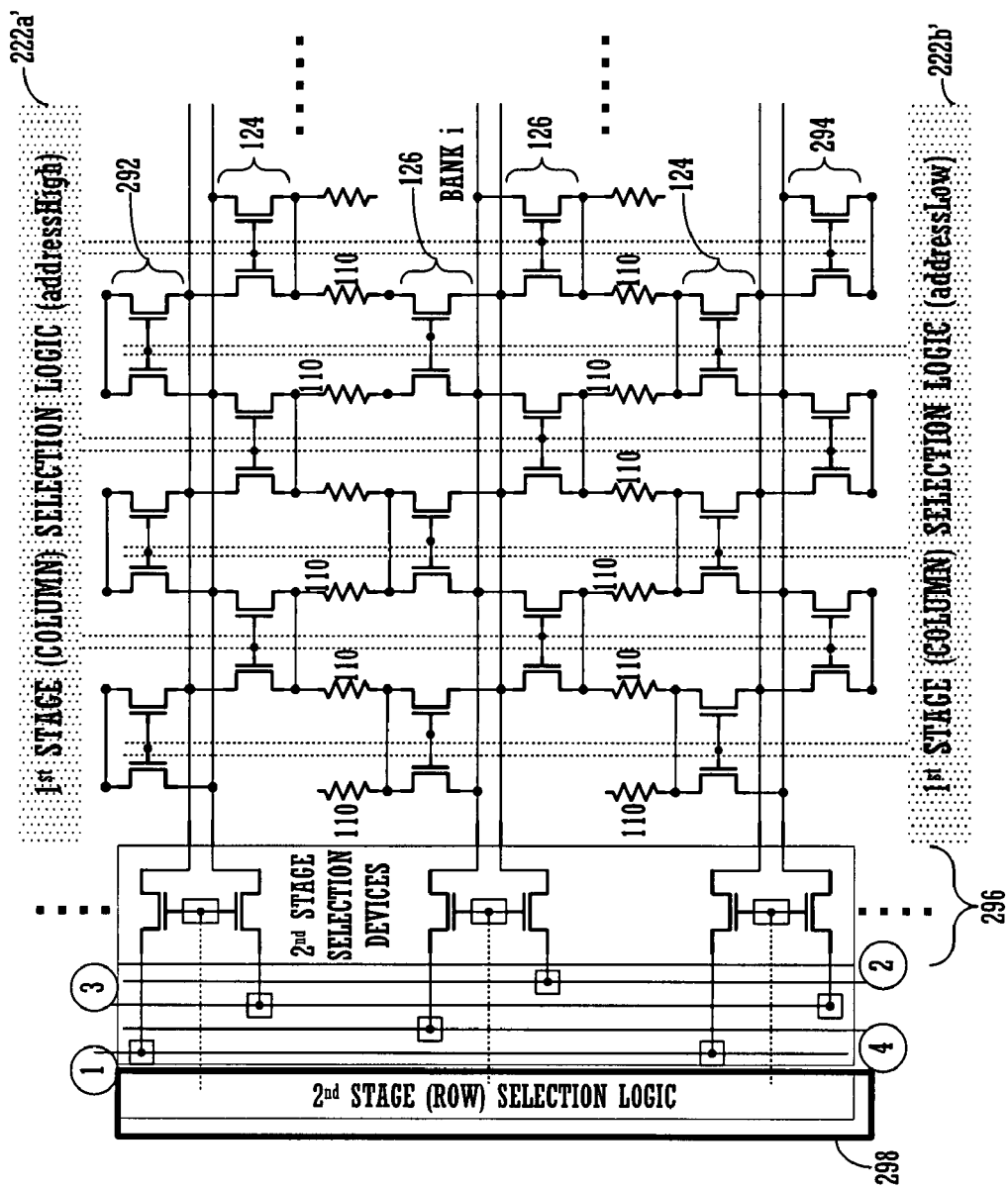
FIG. 11 illustrates stacking of DUT banks in rows, and access circuitry for selecting particular rows of DUTs for 4-TMP testing, in accordance with one embodiment of the present invention.

FIG. 11 illustrates an embodiment where multiple bank rows can be stacked along each other, so as to further increase the sharing between rows, in accordance with one embodiment of the present invention.

First stage column selection logic 222a' and 222b' is used to provide the column selection among both rows of banks (bank i, and bank i+1). Each of the rows is connected to a second stage selection devices 296, which provides coupling access to TMP1, TMP2, TMP3, and TMP4. Selection of the particular rows for accessing TMP1 TMP4 during a given testing operation is enabled by second stage (row) selection logic 298. Selection logic 298 will therefore identify which of the two rows will be activated so that DUTs 110 in the given rows can be accessed by the TMP1-TMP4 pads.

In the illustrated example, the top row (bank i), will include DUTs 110 that are coupled to P-type transistors 124 and N-type transistors 126. Linking transistors 292 are provided that enable linking of the columns and isolation when selection logic dictates. The second row includes N-type transistors 126 that are coupled next to the N-type transistors 126 of the upper row. DUTs 110 are then coupled to the P-type transistors 124 and then to the linking transistors 294. The first stage (column) select logic 222a' and 222b' will therefore enable selection of particular DUTs 110 in a given row when activated, or all the DUTs in a given row when activated, or selected groups of DUTs in a given row when activated, and selected using the first stage column select logic 222a' and 222b'.

Figure 12:
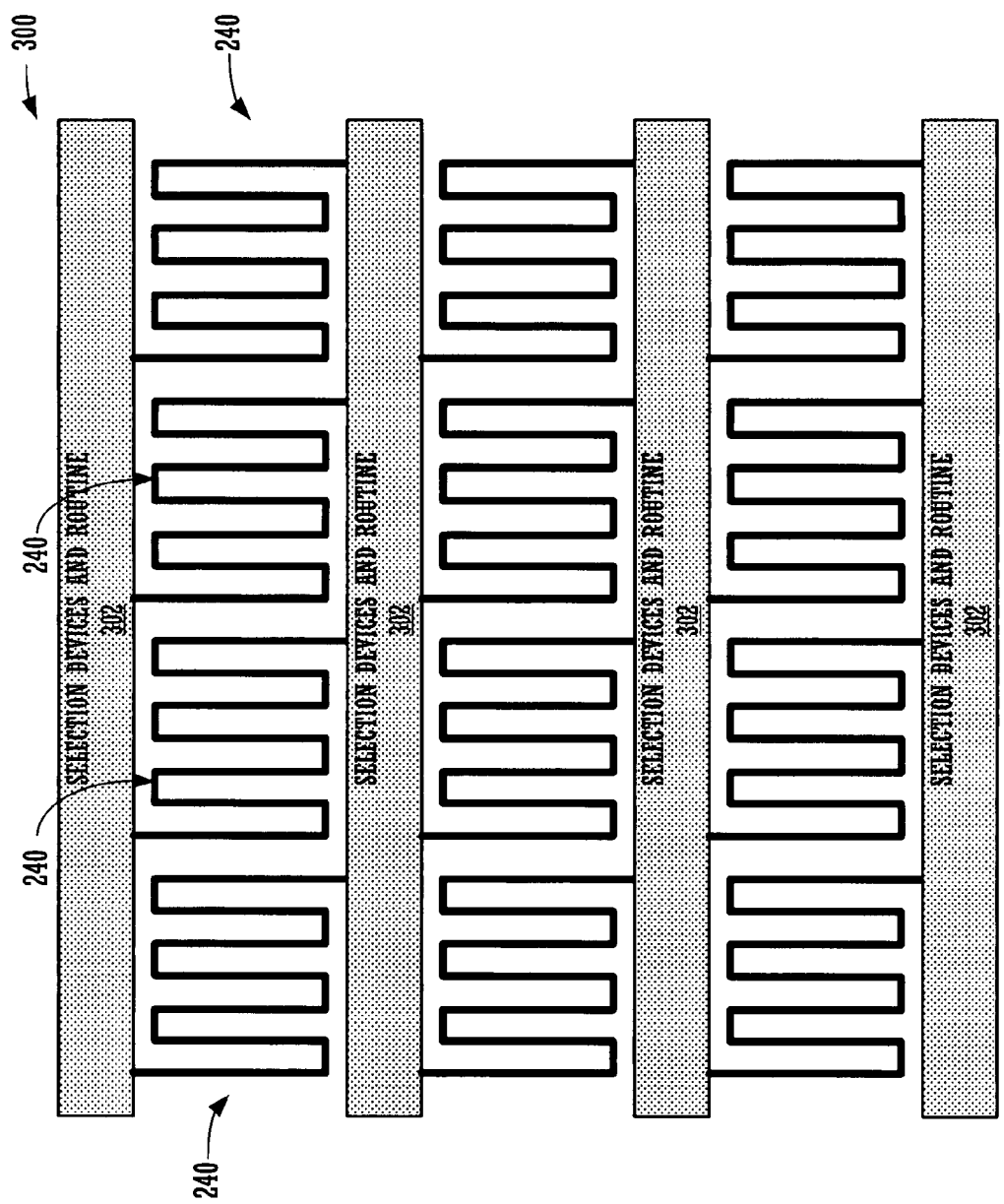
FIG. 12 illustrates a layout configuration of an array of DUT banks, in accordance with one embodiment of the present invention.

FIG. 12 illustrates an example array of multiple banks, which are represented in layout form, using the snake layout 240 shown in FIG. 5, in accordance with one embodiment of the present invention. As shown, each snake layout 240 will include a plurality of DUTs 110. Selection Devices and Routing 302 is also shown, interconnected to each of the snake layouts 240. More detailed DUT selection logic, which has been shown with reference to FIGS. 4A-11, is not illustrated in this layout scheme for ease of illustration. However, when the DUTs 110 are laid out in the snake layout 240 during actual fabrication, access routing will be provided between each of the DUTs 110 and the selection transistors defined to enable 4-TMP testing. That is, each of the DUTs 110 in each of the snake layouts 240 will be addressable for TMP1, TMP2, TMP3, and TMP4 testing and analysis. Additionally, the selection devices and associated logic will enable 4-TMP testing of each of the DUTs 110 simultaneously, or conditionally.

Figure 13:
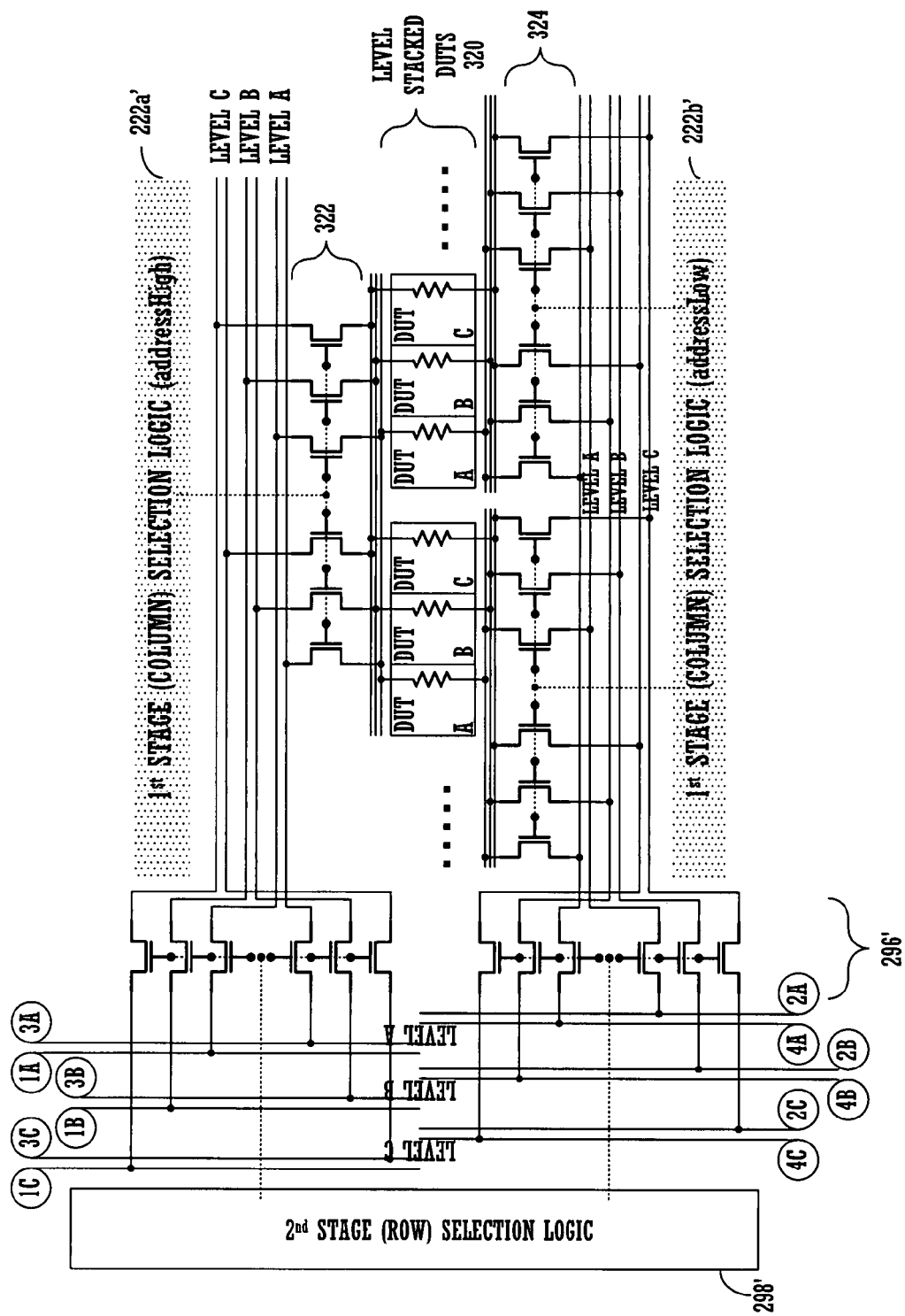
FIGS. 13-15 illustrate DUTs stacked in multiple levels, to define three dimensional DUT bank structures, and associated stage and selection circuitry, in accordance with one embodiment of the present invention.

FIG. 13 illustrates an embodiment where DUTs A, B, and C are arranged on different levels of a semiconductor chip. As noted above, defining one level of bank DUTs 110 may use two or three metal routing levels (e.g., M1, M2, M3). If DUT banks are arranged on different levels, then, for example, DUT A may be fabricated using metal M1-M3, DUT B may be fabricated using metal M4-M6, and DUT C may be fabricated using metal M7-M9. If only two metal layers are needed per level, then DUT A may be fabricated in M1-M2, DUT B may be fabricated in M3-M4, and DUT C may be fabricated in M5-M6. The number of metal levels needed for the particular DUT may be any, however, it should be understood that the defined levels A, B, and C, described in FIG. 13 are vertically stacked, thus defining a 3D structure. The 3D structure of DUTs 110 enables the arrangement of DUTs 110 in one level, by defining banks (rows), and selectable banks as described above. Additionally, the banks can be stacked in different levels.

Still referring to FIG. 13, the DUTs A, B, and C are illustrated to represent DUTs in different levels, to define level stacked DUTs 320. Access transistors 322 and 324 are provided to enable selection of TMP1, TMP2, TMP3, and TMP3, for each level A-C. For each level, different pads are provided, such that a group of Terminal Measurement Points (TMPs), specific for each level are provided.

For example, and with reference to FIG. 13, the following levels have the following TMPs:

level A includes: TMP 1A, TMP 2A, TMP 3A, and TMP 4A level B includes: TMP 1B, TMP 2B, TMP 3B, and TMP 4B level A includes: TMP 1C, TMP 2C, TMP 3C, and TMP 4C Level selection transistors 296' are shown coupled to terminals of the access transistors 322 and 324. Level selection transistors 296' will therefore couple the DUTs of the selected levels to the appropriate TMPs. The first stage column selection logic 222a' and 222b' are also provided to enable selection of entire banks of DUTs 110 within the DUTs A, B, or C, or conditionally selected DUTs 110. Finally, a second stage (row) selection logic 298' is provided, to enable selection of particular rows. Thus, FIG. 13 illustrates superimposed arrays, that enable stacking of DUTs in different layers or levels within the same DUT area. In one embodiment, each set of terminal lines will either get its own set of measurement pads on a chip, or they can be routed through another stage of selection devices. Logic is also shared within one stage and among all levels.

Figure 14:
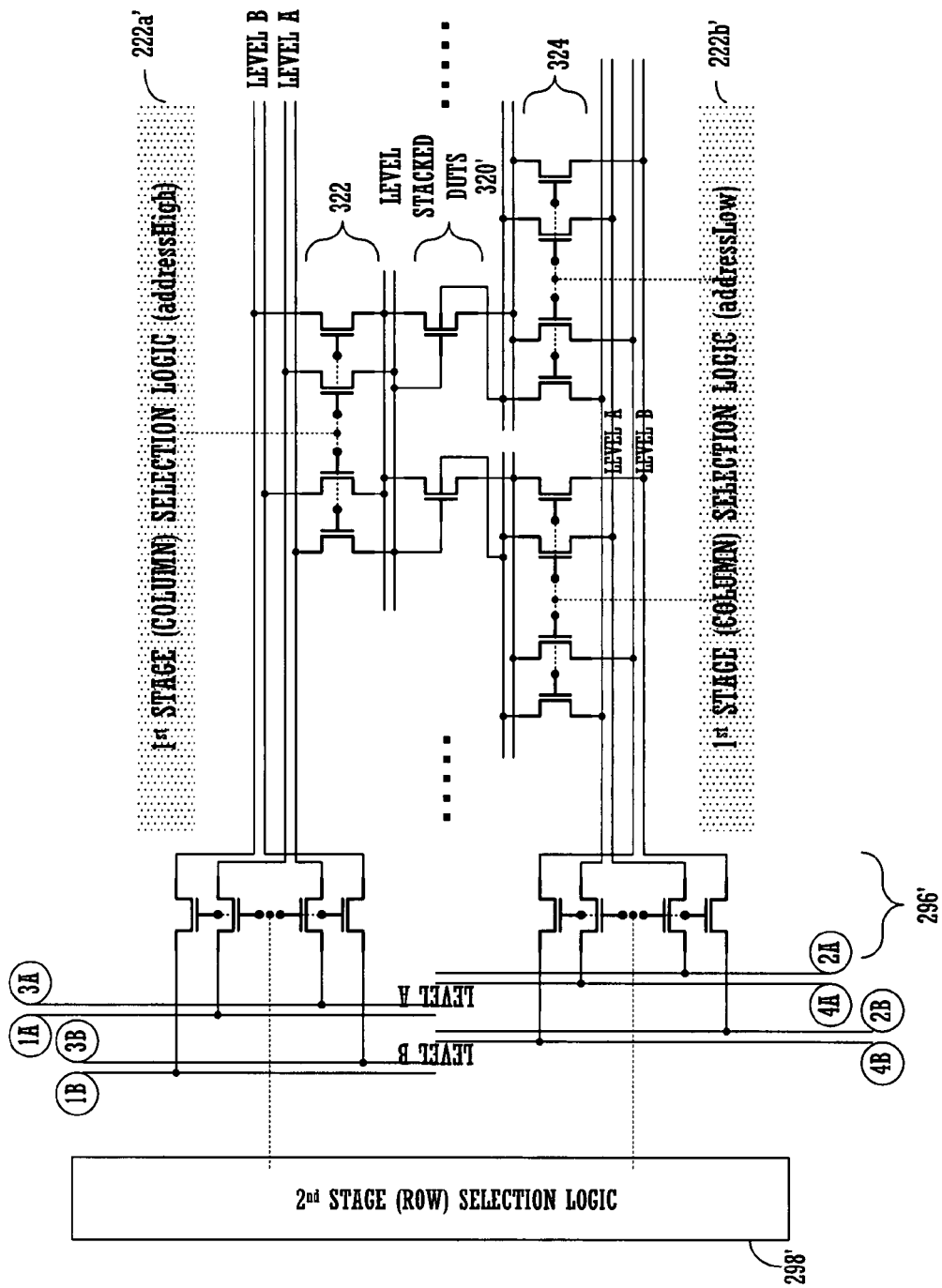

FIG. 14 illustrates another example of superimposed arrays, which can be used to increase the available terminals per level, in accordance with one embodiment of the present invention. For instance, two superimposed sets will provide four terminals per DUT, which can be used to connect all four terminals of the transistors, including gates and wells, to execute leakage measurements among all DUTs. In FIG. 14, access transistors 322 and 324 are shown coupled to the level stacked DUTs 320'. The first stage logic column selection logic 222a' and 222b' is also provided to enable selection of particular DUTs, all DUTs, or conditionally only selected DUTs or groups of DUTs. For completeness, also shown are the level selection transistors 296' and the second stage row selection logic 298'.

Figure 15:
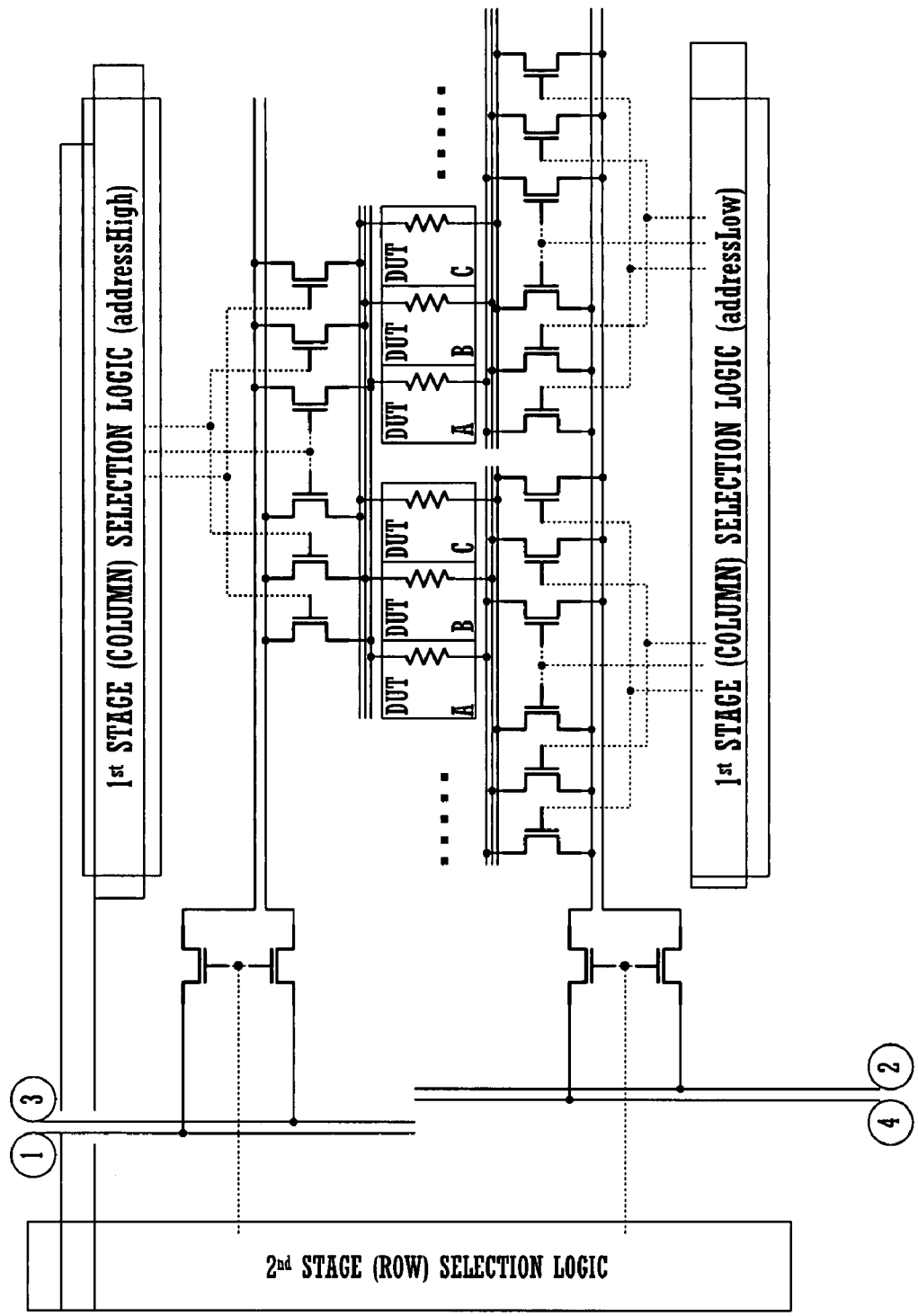

FIG. 15 illustrates an alternative design to that of FIG. 14, having three stacked DUT levels, in accordance with another embodiment of this invention. As shown, in the design, the same set of terminal lines (1, 2, 3, and 4) can be used for all DUT levels (A, B, C, . . . ). This configuration is particularly useful to minimize the necessary routing effort for the terminal lines. A larger address room and a unique set of address lines per DUT level (A, B, C, . . . ) may have to be implemented to distinguish the stacked DUTs within one cell. An advantage of this design is that there is only one set of terminal lines which will get their own set of measurement pads, or they can be routed through another stage of selection devices. Still further, an advantage of this design is that logic is shared within one (1) stage among all levels.

As noted above, the type of DUTs used will depend on the testing goals. In principle, there are two kinds of DUT arrays, where the DUTs can either be active or passive devices. Passive devices are resistors, inductors and capacitors such as snakes, chains, combs, etc. Passive devices do not have a control input to change their behavior. Then there are active devices such as CMOS and bipolar transistors, which do have a control pin, which will change their behavior. There is wide variety of active arrays to particularly characterize CMOS device parameters as for instance disclosed in Quarantelli, M., Saxena, S., Dragone, N., Babcock, J. A., Hess, C., Minehane, S., Winters, S., Chen, J., Karbasi, H., Guardiani, C., "Characterization and Modeling of MOSFET Mismatch of a Deep Submicron Technology", Proc. International Conference on Microelectronic Test Structures (ICMTS), Monterey (USA), 2003, which is incorporated by reference herein. Another CMOS device array is disclosed in Saxena, S., Minehane, S., Cheng, J., Sengupta, M., Hess, C., Quarantelli, M., Kramer, G. M., Redford, M., "Test Structures and Analysis Techniques for Estimation of the Impact of Layout on MOSFET Performance and Variability", Proc. International Conference on Microelectronic Test Structures (ICMTS), Hyogo (Japan), 2004, which is incorporated by reference herein. An array of bipolar devices is disclosed in Einfeld, J., Schaper, U., Kollmer, U., Nelle, P., Englisch, J., Stecher, M., "A New Test Circuit for the Matching Characterization of npn Bipolar Transistors", Proc. International Conference on Microelectronic Test Structures (ICMTS), Hyogo (Japan), 2004, which is incorporated by reference herein.

Another array of CMOS to determine parameter variation of devices is disclosed in Schaper, U., Einfeld, J., Sauerbrey, A., "Parameter Variation on Chip Level", Proc. International Conference on Microelectronic Test Structures (ICMTS), pp 155-158, 2005, which is incorporated by reference herein.

Another array of CMOS to determine parameter variation of devices is disclosed in Schaper, U., Einfeld, J., Sauerbrey, A., "Parameter Variation on Chip Level", Proc. International Conference on Microelectronic Test Structures (ICMTS), pp 155-158, 2005, which is incorporated by reference herein.

In accordance with embodiments of the present invention, the above has defined addressable high accuracy 4 terminal resistance measurements to an array of very small DUT areas, which are required to detect soft fails. One embodiment defines efficient three-dimensional stacking of small DUT areas. In another embodiment, addressing of DUTs in a way that supports conditional testing to reduce test time is provided, where multiple test structures will first be tested as a "union" in parallel, and then be tested in sequence through smaller segments, only if the parallel test has detected a fail.

Other advantages of the present invention include, for instance, the ability to divide the area into DUT boxes. One example, may be 1000 DUT boxes, less or more. Each box areas is small, for instance as small as a "standard cell height" by "standard cell height". The standard cell height for a typical sub 100 nanometer technology is less than about 3 um, and this dimension can be scaled depending on the technology used for the layout and manufacturing devices.

The embodiments also provide excellent localization of failing DUTs. In one embodiment, very accurate resistance measurement within about 100 ohms to about 1 Mohn is possible, with less than about 1% error per DUT. Distinction of soft fails & hard fails is simply conducted with electrical measurements. In line testing is possible at metal 1 and all layers above is possible, as well as conditional testing to reduce test time. These and other advantages have been defined herein, and can be understood with more detail with reference to the figures and the appended claims.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. A circuit for performing four terminal measurement point (TMP) testing of devices under test (DUT) comprising:
    a first transistor providing selectable access to a first terminal measurement point operable to be connected to a first terminal of said DUT;
    a second transistor providing selectable access to a third terminal measurement point operable to be connected to said first terminal of said DUT;
    a third transistor providing selectable access to a second terminal measurement point operable to be connected to a second terminal of said DUT; and a fourth transistor providing selectable access to a fourth terminal measurement point operable to be connected to said second terminal of said DUT, wherein said first terminal measurement point, said second terminal measurement point, said third terminal measurement point, and said fourth terminal measurement point form distinct electrical nodes from each other.

2. A circuit as recited in claim 1, wherein the first transistor comprises a first source/drain and a second source/drain, and wherein the second transistor comprises a first source/drain and a second source/drain, and wherein the first source/drain of the first transistor and the first source/drain of the second transistor are linked together and operable to be coupled to the first terminal of the DUT, wherein the second source/drain of the first transistor is connected to the first terminal measurement point, and wherein the second source/drain of the second transistor is connected to the third terminal measurement point.

3. A circuit as recited in claim 1, wherein the third transistor comprises a first source/drain and a second source/drain, and wherein the fourth transistor comprises a first source/drain and a second source/drain, wherein the first source/drain of the third transistor and the first source/drain of the fourth transistor are linked together and operable to be coupled to the second terminal of the DUT, wherein the second source/drain of the third transistor is connected to the fourth terminal measurement point, and wherein the second source/drain of the fourth transistor is connected to the second terminal measurement point.

4. A circuit as recited in claim 1 further comprising:
a fifth transistor operable for providing a selectable access to a second terminal measurement point of a first adjacent DUT, wherein said first adjacent DUT comprises a first terminal and a second terminal; and
a sixth transistor operable for providing a selectable access to a fourth terminal measurement point of said first adjacent DUT;
wherein the first transistor and the second transistor of the DUT are shared with said first adjacent DUT, wherein said sharing is operable to provide to enable access to a first terminal measurement point and a third terminal measurement point of said first adjacent DUT.

5. A circuit as recited in claim 4 further comprising:
a seventh transistor operable for providing a selectable access to a first terminal measurement point of a second adjacent DUT, wherein said second adjacent DUT is next to said first adjacent DUT, and wherein said second adjacent DUT comprises a first and a second terminal; and
an eight transistor operable for providing a selectable access to a third terminal measurement point of said second adjacent DUT;
wherein the fifth transistor and the sixth transistor of the first adjacent DUT are shared with said second adjacent DUT, wherein said sharing is operable to provide access to a fourth terminal measurement point and a second terminal measurement point of said second adjacent DUT.

6. A circuit as recited in claim 5, wherein the DUT is a first DUT, the first adjacent DUT is a second DUT, and the second adjacent DUT is a third DUT, and wherein the first, second and third DUT are capable of being linked together if the first, second, third, fourth, fifth, sixth, seventh, and eighth transistors are addressed to enable the first, second and third DUTs to be serially linked, and the first, second, third, fourth, fifth, sixth, seventh, and eighth transistors being conditionally addressable to enable access to only selected ones of the first, second and third DUTs.

7. A circuit as recited in claim 6, wherein the first, second and third DUTs are operable to form a bank of DUTs.

8. A circuit as recited in claim 7, wherein each DUT in the bank of DUTs is addressable to enable soft fail analysis and hard fail detection.

9. A circuit as recited in claim 7 further comprising:
the bank of DUTs; and
a second bank of DUTs;
wherein the bank of DUTs and the second bank of DUTs are operable to be alternatively selected using a plurality of first stage selection transistors, the plurality of first stage selection transistors operable for enabling access to the first, second, third, and fourth terminal measurement points of the bank of DUTs or the second bank of DUTs.

10. A circuit as recited in claim 9 further comprising:
a first array of banks defined by the bank of DUTs and the second bank of DUTs; and
a second array of banks defined by two or more banks of DUTs;
wherein the first array of banks and the second array of banks are operable to be alternatively selected using a plurality of second stage selection transistors, the plurality of second stage selection transistors operable for enabling access to third and fourth terminal measurement points, and wherein first and second terminal measurements points associated with each of the first and second array of banks is unique.

11. A circuit as recited in claim 10, wherein the third and fourth terminal measurement points define a voltage path, and wherein each of the first and second terminal measurement points defines a current path.

12. A circuit as recited in claim 7, wherein the bank of DUTs is arranged in a stacked orientation comprising two or more rows of DUTs, and each adjacent DUT of said bank of DUTs shares first column selection logic,
wherein access to each of the two or more rows and access to the first, second, third, and fourth terminal measurement points is provided through second stage selection devices, and wherein second stage row selection logic is operable for selecting one of the two or more rows for being connected to the first, second, third, and fourth terminal measurement points.

13. A circuit for four terminal measurement point (TMP) testing of devices under test (DUT) comprising:
a pair of p-type access transistors, a terminal of each of the pair of p-type access transistors operable for coupling to a first end of the DUT and the other ends of the pair of p-type access transistors operable for coupling to each of a first terminal measurement point and a third terminal measurement point of said DUT;
a pair of n-type access transistors, a terminal of each of the pair of n-type access transistors operable for coupling to a second end of the DUT and the other ends of the pair of n-type access transistors being coupled to each of a fourth terminal measurement point and a second terminal measurement point of said DUT,
wherein said first terminal measurement point, said second terminal measurement point, said third terminal measurement point, and said fourth terminal measurement point form distinct electrical nodes from each other.

14. A circuit as recited in claim 13, wherein DUTs are operable to be arranged in a bank of two or more DUTs, and wherein each DUT of the two or more DUTs share either the pair of p-type access transistors or the pair of n-type access transistors.

15. A circuit as recited in claim 13, wherein the pair of p-type access transistors and the pair of n-type access transistors have their gates coupled together and connected to bank selection logic, the bank selection logic operable to define a condition for testing DUT in a bank of DUTs.

16. A circuit as recited in claim 15 further comprising:
first stage selection transistors operable to enable selection of either the bank of DUTs or a second bank of DUTs, wherein said second bank of DUTs is duplicate of said bank of DUTs, and wherein the first stage selection transistors are operable to provide access to the first, second, third and fourth terminal measurement points.

17. A circuit as recited in claim 16, further comprising:
second stage selection transistors operable for selecting a first array of banks comprising said bank of DUTs and said second bank of DUTs or a second array of banks.

18. A circuit as recited in claim 17, wherein the second stage selection transistors are operable to provide access to the third terminal measurement point and the fourth terminal measurement point, and wherein the first array of banks and the second array of banks each has its own first terminal measurement points and second terminal measurement points.

19. A circuit as recited in claim 16, wherein the bank of DUTs comprises two or more rows, and wherein each row is independently selectable by second stage row selection logic, and wherein a first stage column select logic is operable to select one or more DUTs in a row of said two or more rows.

20. A circuit for performing four terminal measurement point (TMP) testing of devices under test (DUT) comprising:
a first transistor providing selectable access to a first terminal measurement point operable to be connected to a first terminal of said DUT;
a second transistor providing selectable access to a third terminal measurement point operable to be connected to said first terminal of said DUT;
a third transistor providing selectable access to a second terminal measurement point operable to be connected to a second terminal of said DUT; and
a fourth transistor providing selectable access to a fourth terminal measurement point operable to be connected to said second terminal of said DUT;
wherein the first, second, third and fourth transistors are the only transistors local to the DUT for enabling the four terminal measurement point (TMP) testing, and wherein said first terminal measurement point, said second terminal measurement point, said third terminal measurement point, and said fourth terminal measurement point form distinct electrical nodes from each other.

* * * * *